(12) United States Patent
Thordarson et al.

(10) Patent No.: US 10,297,339 B2
(45) Date of Patent: May 21, 2019

(54) INTEGRATED COOLING SYSTEM FOR ELECTRONICS TESTING APPARATUS

(71) Applicant: Advantest Corporation, Tokyo (JP)

(72) Inventors: Brent Thordarson, San Jose, CA (US); John W. Andberg, Santa Cruz, CA (US); Koei Nishiura, Kumagaya (JP)

(73) Assignee: Advantest Corporation, Tokyo (JP)

( * ) Notice: Subject to any disclaimer, the term of this patent is extended or adjusted under 35 U.S.C. 154(b) by 993 days.

(21) Appl. No.: 14/184,549

(22) Filed: Feb. 19, 2014

(65) Prior Publication Data

US 2015/0233967 A1    Aug. 20, 2015

(51) Int. Cl.
| | |
|---|---|
| G05D 23/00 | (2006.01) |
| G01R 31/10 | (2006.01) |
| G01R 31/00 | (2006.01) |
| G06F 1/20 | (2006.01) |
| H05K 5/00 | (2006.01) |
| H05K 7/20 | (2006.01) |
| G11C 29/56 | (2006.01) |
| G01R 31/28 | (2006.01) |

(52) U.S. Cl.
CPC .... G11C 29/56016 (2013.01); G01R 31/2834 (2013.01); G01R 31/2851 (2013.01); G01R 31/2877 (2013.01); H05K 7/20218 (2013.01); H05K 7/20236 (2013.01)

(58) Field of Classification Search
CPC .......... H05K 7/20236; H05K 7/20218; G01R 31/2834; G01R 31/2851
USPC .......... 165/287; 324/750.14, 750.03, 750.06, 324/750.09; 361/679.47
See application file for complete search history.

(56) References Cited

U.S. PATENT DOCUMENTS

| | | | | |
|---|---|---|---|---|
| 3,301,318 | A * | 1/1967 | Haake | B01L 7/00 165/104.31 |
| 3,370,454 | A * | 2/1968 | Flores | G01K 15/00 165/108 |
| 4,590,538 | A * | 5/1986 | Cray, Jr. | H05K 7/20236 361/700 |
| 4,625,096 | A * | 11/1986 | Fletcher | B01L 7/02 392/441 |
| 4,848,925 | A * | 7/1989 | Jacques | H01H 37/00 374/1 |
| 6,864,698 | B2 * | 3/2005 | Mirkhani | G01R 31/2851 165/80.2 |
| 6,882,156 | B2 * | 4/2005 | Hauptman | G01R 31/31905 324/512 |
| 7,285,851 | B1 * | 10/2007 | Cepeda-Rizo | G06F 1/20 257/712 |
| 2003/0151883 | A1 * | 8/2003 | Hauptman | G01R 31/31905 361/514 |

(Continued)

*Primary Examiner* — Paul Alvare

(57) ABSTRACT

Example features or aspects of the present invention are described in relation to a small, quiet integrated cooling system for an apparatus for testing electronic devices. Characteristics of the test apparatus including a low noise output, low power consumption and a compact size with a small spatial and volume footprint are selected for deployment and use in a an office like environment. The test apparatus comprises a chassis frame and a cooler frame disposed within the chassis frame and thus integrated within the test apparatus, which has a reduced form factor suitable for the in-office deployment. Embodiments offer the ability to maintain the working fluid at a constant temperature.

12 Claims, 9 Drawing Sheets

(56) References Cited

U.S. PATENT DOCUMENTS

| | | | | |
|---|---|---|---|---|
| 2004/0221604 A1* | 11/2004 | Ota | ............... | H05K 7/20781 |
| | | | | 62/259.2 |
| 2005/0030052 A1* | 2/2005 | Beaman | ............ | G01R 31/2874 |
| | | | | 324/750.08 |
| 2007/0267741 A1* | 11/2007 | Attlesey | ............... | G06F 1/20 |
| | | | | 257/714 |
| 2008/0223555 A1* | 9/2008 | Di Stefano | ............ | F25B 49/02 |
| | | | | 165/101 |

* cited by examiner

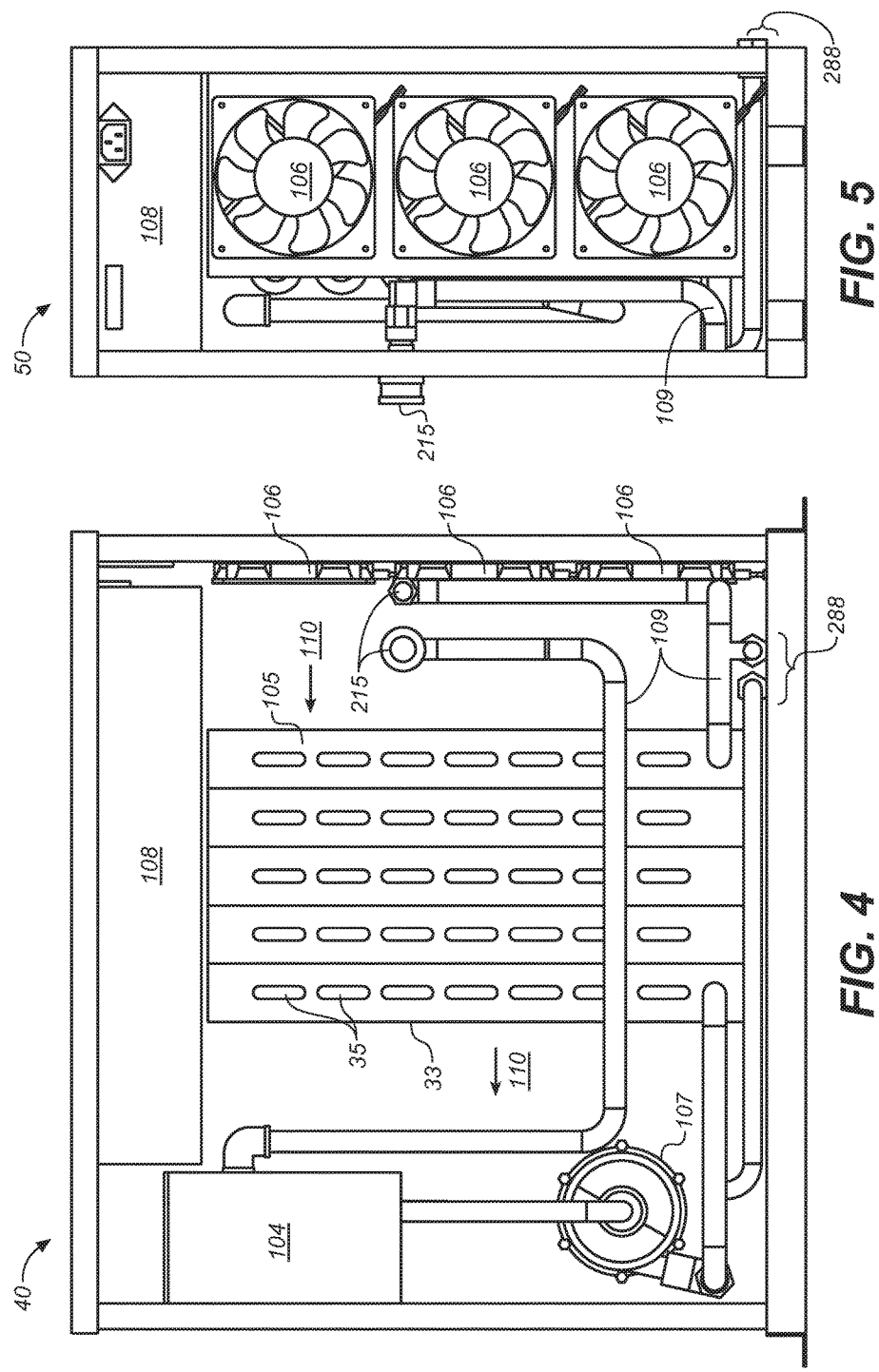

Example Cooling Process
70

```
┌─────────────────────────────────────────────────────────────────────────┐
│ Supply cool liquid working fluid primary coolant at a 1st temperature to │
│ multiple test processors bathed within the supplied liquid working fluid during │──71
│ an operation of multiple processors related to the testing of multiple DUTs │
└─────────────────────────────────────────────────────────────────────────┘
                                    │
                                    ▼
┌─────────────────────────────────────────────────────────────────────────┐
│ Transfer heat generated in each of the multiple processors during and related to the │
│ operation thereof to the liquid working fluid bath, in which the liquid working fluid │──72
│ primary coolant is heated to a 2nd temperature, which is higher than the 1st temperature │
└─────────────────────────────────────────────────────────────────────────┘
                                    │
                                    ▼
        ┌─────────────────────────────────────────────────────┐
        │ Transport the hot liquid working fluid at the 2nd   │──73
        │ temperature away from the multiple processors       │
        └─────────────────────────────────────────────────────┘
                                    │
                                    ▼
    ┌────────────────────────────────────────────────────────────────┐
    │ Transfer the heat from the transported hot liquid working fluid │
    │ at the 2nd temperature to a gaseous working fluid of a secondary │──74
    │ coolant, which comprises an atmospheric heat sink              │
    └────────────────────────────────────────────────────────────────┘
                                    │
                                    ▼
┌─────────────────────────────────────────────────────────────────────────┐
│ Control a temperature range of the liquid working fluid primary coolant, e.g., │
│ approximately between the 1st temperature and the 2nd temperature, based on a │──75
│ sensed temperature of the liquid working fluid and/or the gaseous working fluid │
└─────────────────────────────────────────────────────────────────────────┘
```

*FIG. 7*

INTEGRATED COOLING SYSTEM FOR ELECTRONICS TESTING APPARATUS

FIELD OF THE INVENTION

Embodiments of the present invention relate generally to cooling electronics apparatus. More particularly, an example embodiment of the present invention relates to a cooling system for electronics that test other electronic devices.

BACKGROUND

Automated test equipment (ATE) comprises apparatus operable for performing high speed testing on semiconductor devices. The testing is conducted to verify that the devices function properly during and after their development, fabrication, manufacturing and production processes. Some ATE apparatus specializes in testing memory devices, such as flash data storage (flash) and dynamic random access memory (DRAM).

To improve speed and efficiency and reduce costs associated with testing memory devices, such as flash memory devices for instance, some memory test apparatus (memory testers) implement memory core testing using a built off-chip test (BOST) configuration, in which a test head proximate to the devices under test, or DUTs, both interfaces with each of the multiple DUTs and performs a significant portion of the processing associated with testing. Such testers may comprise a component of an engineering workstation, which is typically deployed in a laboratory.

Memory testers write (input) patterns of test data signals to a plurality of DUTs. The signals are written addressably over each of an array of memory cells of the DUT. Current memory technology supports high density arrays of memory cells, which is expected to expand as the technology continues to develop. The memory tester reads a resulting output from each of the myriad DUTs, measures various test parameters relating to the test pattern and computes fast, complex algorithms to evaluate the measurements and thus characterize the DUTs.

The processing load borne by the test head is based on the size of the array of memory cells in the DUTs. The test head may have multiple test site processors (TSPS), each of which dedicated to testing a particular one of the multiple DUTs. Coupled with the speed at which the testing and related processing is conducted, these processing loads can generate considerable amounts of power within their small volumes. The heat is dissipated over a portion of their surface areas into the surrounding air or another heat sink in contact therewith.

Dissipating the heat effectively prevents excessive temperature rise within the TSP, which could otherwise cause problems executing or processing testing accurately. Some TSPS may operate best over a tightly controlled temperature range, yet may also produce a lot of heat. With higher heat capacity than gas, liquids are sometimes used to cool TSPS. For example, the TSP may be operated while bathed in an electrically insulating and chemically inert liquid coolant. As the TSP generates heat while computing test processing tasks, the heat is dissipated into the liquid coolant.

The heat transferred from the TSPS into the primary coolant bath is typically removed by subsequent transfer to another secondary liquid through the walls of a heat exchanger, or by refrigeration. However, both heat exchanger based and refrigerator based approaches to removing the heat from the liquid coolant require additional equipment, which occupies considerable space and consumes significant amounts of power, both of which may be at a premium in the laboratory in which the memory tester engineering work station may be deployed.

Moreover, noise and waste heat dissipated into the laboratory space by liquid to liquid heat exchanger based cooling systems and/or refrigeration based cooling systems may raise ambient sound and temperature levels to unacceptable values. Associated mechanical equipment such as tube and shell heat exchangers, valves, piping and pipe supports, and pumps and associated electrical power and control equipment make the heat exchanger based approach especially challenging to apply in confined, quiet office areas.

SUMMARY

A small form factor system is described herein using a liquid coolant with an adequate heat capacity to cool the test processors of an ATE apparatus during the testing of multiple electronic DUTs. It would also be useful to subsequently remove the heat generated by the test processors from the liquid coolant without using additional liquid-to-liquid heat exchange systems or refrigeration systems and the ancillary piping, valves, pumps and other components of associated liquid transport systems. Further, it would also be useful to operate the ATE apparatus and cool the test processors thereof within a quiet office environment having limited space, without raising ambient noise or temperature levels above acceptable levels for such settings or demanding additional space or utility provisions therein.

An example embodiment of the present invention is described in relation to a small, quiet integrated cooling system for an apparatus for testing electronic devices. Characteristics of the test apparatus including a low noise output, low power consumption and a compact size with a small spatial and volume footprint are selected for deployment and use in a small laboratory or a regular office type environment. The test apparatus comprises a chassis frame and a cooler frame disposed within the chassis frame and thus integrated within the test apparatus, which has a reduced form factor suitable for office deployment.

The cooling system comprises one or more bay components operable for bathing a plurality of processors of the test apparatus within a liquid working fluid during an operation of the plurality of processors related to the testing of the plurality of devices under test wherein heat related to the operation is transferred to the liquid working fluid. A heat exchange component of the cooling system is disposed within the cooler frame of the test apparatus and is operable for transferring heat from the liquid working fluid to an atmospheric heat sink (e.g., ambient air). The cooler frame and the bay components are small enough for deployment in a typical office setting.

In an example embodiment of the present invention, the liquid working fluid comprises Fluorinert™ or another fluorocarbon based coolant. A pump component of the cooling system is disposed within the cooler frame of the test apparatus and is operable for continuously circulating or transporting the liquid working fluid through and between the bay components and the heat exchanger component. The pump within the cooler frame is quiet enough for deployment in a typical office setting. In a preferred embodiment, a pump draws the heated fluid from the bay and delivers it to the heat exchanger. In an alternative embodiment, the pump comprises a centrifugal pump, which draws an intake of cooled liquid working fluid from an outlet of the heat exchanger and discharges the cool liquid working fluid with force sufficient to flow to and through the bay component and return to an inlet of the heat exchanger The cooler frame containing the heat exchanger, the pump and associated piping and other mechanical components, along with the bay components and an associated test processor module card cage and interfaces are of suitable size for deployment in a typical office setting. The bay components may be mounted to the test processor module printed circuit assemblies covering the multiple test processors therein proximate to a respective DUT of an array of DUTs and electrically coupled thereto via a test interface for exchanging test data signals related to a test pattern generated by a test controller of the test apparatus. In one exemplary embodiment, the bay is attached to each of the individual printed circuit board assemblies with the components to be cooled, thereby creating an enclosed volume with a fluid inlet and outlet.

The cooling system has a controller component operable for controllably regulating a temperature range of the liquid working fluid. The controller may comprise temperature sensors operable for sensing a temperature of the liquid working fluid coolant and a temperature of the atmospheric heat sink and for actuating a device for regulating the liquid working fluid temperature range based on the sensed temperature. An example embodiment is implemented in which the sensors provide input to a component, such as a microcontroller or a field programmable gate array, which is programmed and/or configured for controllably regulating the liquid working fluid temperature.

In an example embodiment of the present invention, the cooling system is operable for performing a process for cooling the liquid working fluid. The process comprises supplying (e.g., pumping) a liquid working fluid at a first temperature to the plurality of processing components wherein the plurality of processing components is bathed within the supplied liquid working fluid during an operation of the plurality of processing components related to the testing of the multiple DUTs. Heat generated in each of the multiple processing units during and operation thereof is transferred to the liquid working fluid. The liquid working fluid is thus heated to a second temperature, which is higher than the first temperature, and then transported away from the plurality of processors under the force of the pumping. The heat is then transferred within a liquid-to-gas heat exchanger from the heated liquid working fluid at the second temperature to an atmospheric heat sink (e.g., a stream of ambient air).

A temperature of the liquid working fluid and/or the atmospheric heat sink is sensed and a temperature range of the liquid working fluid is controlled based on the sensed temperature. In an example embodiment, the cooling system holds the temperature of the liquid working fluid essentially constant.

In an example embodiment of the present invention, test processors bathed within a liquid coolant test multiple electronic DUTs. Heat from the processors is transferred to the liquid coolant. A heat exchanger transfers heat from the liquid coolant to air. Thus, the liquid working fluid comprises a primary coolant and the air stream comprises a gaseous working fluid secondary coolant and an atmospheric heat sink. A pump circulates the liquid coolant between the processors and heat exchanger. A temperature range of the liquid coolant is regulated based on the sensed temperatures and may be held essentially constant.

Thus, an example embodiment of the present invention relates to a small form factor liquid to gas cooling system, which uses a liquid coolant of adequate heat capacity to cool the test processors of an ATE apparatus during the testing of multiple electronic DUTs therewith. An example embodiment also subsequently removes the heat generated by the test processors from the liquid coolant without using additional relatively large liquid-to-liquid heat exchange systems or refrigeration systems or ancillary piping, valves, pumps or other components of an associated liquid transport system. Further, an example embodiment of the present invention provides ATE apparatus with liquid cooled test processors therein, which are operable within quiet office environments without raising ambient noise or temperature levels above acceptable levels for such settings or demanding additional space or utility provisions therein.

BRIEF DESCRIPTION OF THE DRAWINGS

An embodiment of the present invention is described in relation to a small, quiet integrated cooling system for an apparatus for testing electronic devices, which may be deployed and used in an office environment. The accompanying drawings below comprise a part of the specification herein of example embodiments of the present invention and are used for explaining features, elements and attributes thereof.

Principles of example embodiments are described herein in relation to each figure (FIG.) of these drawings, in which like numbers are used to reference like items, and in which:

FIG. 4 depicts a side view of an example cooler frame, according to an embodiment of the present invention;

FIG. 5 depicts an end view of an example cooler frame, according to an embodiment of the present invention;

FIG. 7 depicts an exemplary flowchart for an example cooling process, according to an embodiment of the present invention.

Figure 1:
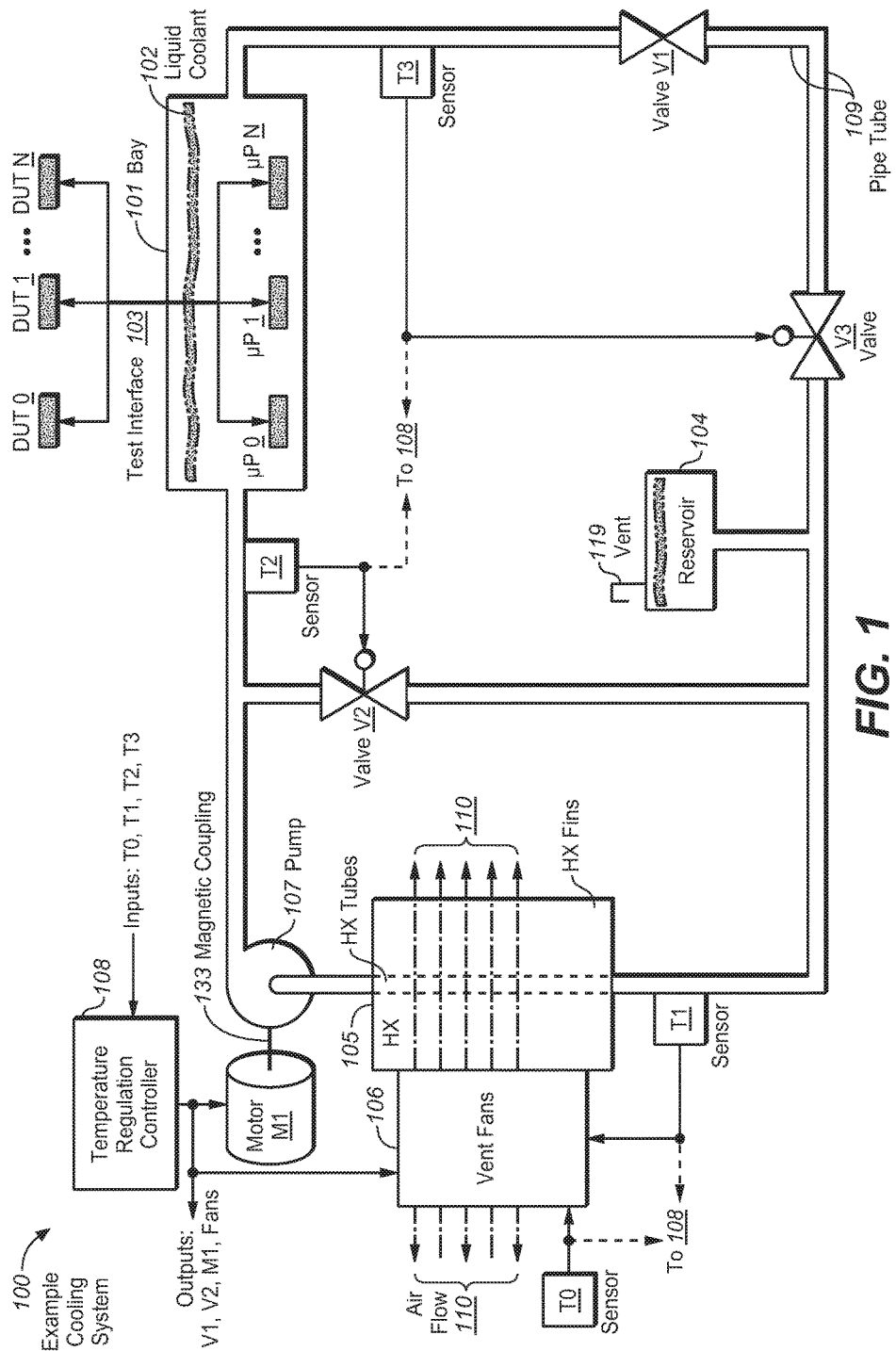
FIG. 1 depicts an example cooling system for ATE apparatus, according to an embodiment of the present invention.

No particular scale or perspective applies in these figures, unless stated otherwise.

DESCRIPTION OF EXAMPLE EMBODIMENTS

An embodiment of the present invention relates to a small, quiet integrated cooling system for an apparatus for testing electronic devices, which may be deployed and used in an office environment. Characteristics of the test apparatus including a low noise output, low power consumption and a compact size with a small spatial and volume footprint are selected for deployment and use in a regular office or small laboratory type environment.

In an example embodiment of the present invention, test processors bathed within a liquid coolant test multiple electronic DUTs. Heat from the processors is transferred to the liquid coolant. A heat exchanger transfers heat from the liquid coolant to air. A pump circulates the liquid coolant between the processors and heat exchanger. A temperature range of the liquid coolant is regulated based on the sensed temperatures.

Reference will now be made in detail to implementations of the example embodiments as illustrated in the accompanying drawings. The same reference numbers will be used to the extent possible throughout the drawings and the following description to refer to the same or like items. It should be apparent to artisans of ordinary skill in technologies that relate to testing memory and other semiconductor devices however, that example embodiments of the present invention may be practiced without some of these specifically described details. Example embodiments of the present invention are described in relation to an integrated cooling system for an apparatus for testing electronic devices.

For focus, clarity and brevity, as well as to avoid unnecessarily occluding, obscuring, obstructing or obfuscating features that may be somewhat more germane to, or significant in explaining example embodiments of the present invention, this description may avoid describing some well-known processes, structures, components and devices in exhaustive detail. Artisans of ordinary skill in technologies related to cooling and other mechanical systems and processes should realize that the following description is made for purposes of explanation and illustration and is not intended to be limiting in any way. On the contrary; other embodiments and equivalents should readily suggest themselves to artisans of such skill in relation to the example features and elements described herein and to any corresponding benefits such embodiments may realize. An example embodiment of the present invention is described in relation to a small, quiet cooling system integrated into a small form factor apparatus for testing electronic devices, which may be deployed and used in an office space.

While embodiments are described herein with reference to an example a cooling system integrated into an apparatus for testing electronic devices, it should be appreciated that this is by way of illustration, example, clarity, brevity and simplicity of description. Moreover, artisans of ordinary skill in cooling and other mechanical technologies should especially appreciate and understand that the scope of embodiments of the present invention thus covers integrated cooling systems more generally than described herein and more particularly, to cooling not only ATE and test apparatus, but other apparatus as well. Characteristics of the apparatus include low noise output, low power consumption and a compact size with small spatial and volume footprints. The apparatus may thus be deployed and used in laboratory and/or office milieus. The test apparatus comprises a chassis frame and a cooler frame disposed within the chassis frame and thus, integrated within the test apparatus.

The cooling system comprises a bay, which is operable for bathing multiple processors of the test apparatus within a liquid working fluid during an operation of the processors related to the testing multiple DUTs. Heat related to the processors' operation is transferred to the liquid working fluid. A heat exchanger is disposed within the cooler frame of the test apparatus and is operable for transferring heat from the liquid working fluid to an ambient air atmospheric heat sink. A pump is disposed within the cooler frame and is operable for continuously circulating (transporting) the liquid working fluid through and between the bay and the heat exchanger. The cooling system has a controller, which is operable for controllably regulating a temperature range of the liquid working fluid. The controller may comprise temperature sensors operable for sensing a temperature of the liquid working fluid coolant and a temperature of the atmospheric heat sink and for actuating a device for controllably regulating the liquid working fluid temperature based on the sensed temperatures.

In an example embodiment of the present invention, test processors bathed within a liquid coolant test multiple electronic DUTs. Heat from the processors' operations is transferred to the liquid coolant. A heat exchanger transfers heat from the liquid coolant to air. A pump continuously circulates the liquid coolant between the processors and heat exchanger. A temperature range of the liquid coolant is controllably regulated based on the sensed temperatures.

Example Cooling System and ATE Apparatus

FIG. 1 depicts an example cooling system 100 for ATE apparatus, according to an embodiment of the present invention. An embodiment of the present invention relates to a small, quiet integrated cooling system for an apparatus for testing electronic devices (such as flash memory devices, for instance), which may be deployed and used in an office environment. Characteristics of the test apparatus including a low noise output, low power consumption and a compact size with a small spatial and volume footprint are selected for deployment and use in a regular office like environment. The cooling system 100 is disposed within a small, quiet test apparatus, which may be deployed in an office setting and is operable therein for testing a plurality of devices under test (DUTs) without raising the ambient sound levels or ambient air temperatures therein excessively for such a space or making excessive demands on utilities such as power and/or air conditioning.

The cooling system 100 comprises a bay component (bay) 101, which is operable for bathing a plurality of processors (µP) of the test apparatus within a liquid working fluid 102. The test processors are bathed in the liquid working coolant 102 during an operation of the plurality of processors related to the testing the plurality of DUTs. Thus, the heat generated in relation to the operation of the processors is transferred to the liquid working fluid 102.

The liquid working fluid 102 comprises a substance or mixture with a specific heat capacity sufficient to allow the efficient use thereof as a thermal coolant operable for removing heat from a heat source bathed therein and/or disposed within a moving or circulating fluid stream thereof. The coolant 102 comprises an electrically non-conductive (e.g., insulating) and dielectric and chemically non-reactive (e.g., inert) liquid with viscosity, density, surface and interfacial tension, hydraulic and other material characteristics that allow efficient flow thereof and heat exchange therewith over a full range of operating temperatures of the system 100. For example, the primary coolant may comprise a fluorocarbon based liquid material such as Fluorinert™ (e.g., Fluorinert™ FC-3283, commercially available from 3M, a corp. doing business in Delaware), or a coolant substantially similar thereto in relation to one or more significant aspects or attributes. The primary coolant may comprise a fluorocarbon based or other liquid. The primary coolant may comprise de-ionized pure water.

The processors are disposed in a test head of the test apparatus, proximate to the multiple DUTs. Each of the multiple DUTs 0, 1, . . . , N (in which N represents a positive whole number greater than one) is tested by a respective one of the multiple test processors µP 0, µP 1, . . . µP N, to which it is connected and exchanges data signals via a test interface 103. During operation, the processors µP 0, µP 1, . . . µP N write input test data signals corresponding to a test pattern being run to the respective DUT to which it corresponds, read output response data signals from the respective DUT and computes a test related evaluation based on the output.

A heat exchange component (heat exchanger) 105 is operable for transferring heat from the liquid working fluid to an atmospheric heat sink. Pipe tubing 109 couples an outlet of the bay 101 to an inlet of the heat exchanger 105. The tubes of the heat exchanger 105 are disposed in conductive thermal contact within an array of parallel, substantially planar heat conducting and radiating plates (e.g., cooling fins) thereof, though which the tubes are routed. An example embodiment may be implemented in which the tubes comprise a repetitively articulating array of tube sections joined together by common "U" shaped ends disposed within an array of parallel cooling fins. The heat exchanger 105 may comprise one or more sections.

The atmospheric heat sink may comprise air, e.g., from an ambient laboratory of office space in which the test apparatus is deployed. A ventilation component (ventilator) 106 attached, or disposed in proximity to the heat exchanger 105. The ventilator 106 may comprise one or more fans, which draw in a flow 110 of air over the surface of the parallel cooling fins. The heat exchanger 105 thus transfers the heat, which is removed from the operating processors by the liquid working fluid 102 and transported thereto through the pipe tubing 109, to the gaseous working fluid and thus, to the atmospheric heat sink.

An example embodiment may be implemented in which the cooling system 100 provides as much as 750 Watts (W) of cooling capability. Larger coolers may be implemented to provide 1000 W (for instance) or more of cooling capacity. Smaller coolers may be implemented to provide 250 W (for instance) or less, which may achieve and smaller noise levels and/or spatial footprints.

The liquid working fluid comprises a primary coolant, which is in direct contact with the operating processor heat sources. Thus, gaseous working fluid comprises a secondary coolant, which withdraws heat from the primary coolant and thus transfers the withdrawn heat to the atmospheric heat sink, from which it is drawn.

A pump component (pump) 107 draws a net positive suction head over the cooler liquid working fluid 102 at the outlet of the bay 101. An example embodiment may be implemented in which the pump 107 comprises a centrifugal pump in which an internal impeller is driven by shaft 133, which is magnetically coupled to a motor M1 to provide kinetic energy to the liquid working fluid within an internal volute of the pump. Sealed mechanical couplings may be used with some coolants of other than a fluorocarbon base. The cool liquid working fluid 102 is thus pumped from a discharge of the pump 107 to the inlet of the heat exchanger 105 then to the inlet of the bay 101, where it may then resume absorbing heat produced by the operating test processors and the cooling system 100 may then repeat the cooling cycle essentially continuously as the primary coolant circulates through the system 100.

An example embodiment may be implemented in which the pump 107 is operable for maintaining a flow rate of from two (2) to six (6) liters per minute (L/Min) (approx. 1.6 gallons per min.) through the heat exchanger 105. The pump 107 is operable to develop and sustain a differential pressure across the coolant system of 200 Kilopascals (kPa) and a maximum pressure of 300 kPa at or near the inlet of the bay 101. Each of the multiple test modules within the bay 101 may have coolant flow rates of 1.2 L/Min and/or the bay 101 may have a total coolant rate of approx. 3 L/min.

During operation, the cooling system 100 and the test apparatus in which it is disposed generate sound levels that do not exceed 60 dBA (Decibels, A-Weighted), for example, or equivalent units for measuring and rating levels of ambient environmental noise. The cooling system 100 and the test apparatus in which it is integrated are thus operationally deployable in laboratory or office environments without generating undesirable noise levels therein.

The cooling system 100 comprises one or more controller components (controllers), which may each comprise a sensor device operable for sensing a parameter affecting the cooling system 100 and an actuator operable for actuating a feature of the system based on the parameter. For example, the cooling system 100 may comprise a temperature sensor T0. The temperature sensor T0 is operable to sense the temperature of the atmospheric heat sink and to adjust the flow of the gaseous working fluid 110 based on the sensed temperature, such as by energizing or deenergizing one or more of the fans of the ventilator 106 or adjusting a speed thereof.

An example embodiment may be implemented in which the liquid working fluid 102 coolant supply temperature, measured for example at a point between the discharge of the pump 107 and inlet of the bay 101, is controlled to maintain an essentially constant operating temperature below 35 degrees Celsius (C). This operational maximum temperature may be sustained with ambient air temperatures ranging from 20 C to 30 C, inclusive. A temperature margin above and/or below the normal operating temperature range may be maintained. An example embodiment may be implemented in which the liquid working fluid 102 coolant supply temperature is controlled to maintain a maximum fluctuation of the operational temperature of less than or equal to plus or minus one degree C. (±1 C).

An example embodiment may be implemented in which the controller component of the cooling system 100 comprises a temperature regulation controller (temperature regulator) 108 operable for receiving an input from one or more sensors and regulating the temperature of the liquid working fluid 102 based on the received inputs. Thus, the sensor T0 may additionally (or alternatively) be operable to sense the temperature of the air gaseous working fluid and signal the sensed air temperature to the temperature regulator 108, which may then be operable to adjust the fan speed. Based on the sensed air temperature for example, one or more fans may be started and/or stopped and/or while running, the operating speed of the fan may be adjusted between 20% and 100% of its nominal maximum speed. The cooling system 100 may also comprise one or more other temperature sensors.

For example, a temperature sensor T1 is operable for sensing a temperature of the heat laden liquid working fluid 102 prior to cooling at or near the inlet to the tubes of the heat exchanger 105 and for adjusting the fan speed, air flow 110, etc. based on the sensed liquid working fluid temperature there. The sensor T1 may additionally (or alternatively) be operable to signal the sensed air temperature to the temperature regulator 108, which may then be operable to adjust the fan speed. A temperature sensor T2 and a temperature sensor T2 are operable for sensing a temperature of the liquid working fluid 102 at an inlet of the bay 101 and at an outlet thereof, respectively.

The cooling system 100 may comprise one or more valves, which may disposed at various locations over the pipe tubing 109 and are operable for allowing, stopping or throttling a flow of the liquid working fluid by based on a position of an internal disk of the valve in relation to an internal seat thereof. A valve V1 may comprise a globe valve and may be set to have fixed position to allow full flow, allow flow at some rate less than full flow or to stop flow. An example embodiment may be implemented with a valve V2, which is operable under an actuation by a temperature sensor T2 or T3 to open a path with which the cool liquid working fluid may bypass the heat exchanger 105, as actuated to open.

Additionally (or alternatively), the output of temperature sensor T2 and/or T3 may comprise an input to the temperature regulator 108 and thus, their actuating operations may thus be provided as an output thereof. The temperature sensor T2 senses the temperature of the cooled liquid working fluid downstream of the pump 107 and/or upstream of the inlet of the bay 101. The temperature sensor T3 senses the temperature of the heated liquid working fluid downstream of the bay 101 and upstream of the heat exchanger 105. An example embodiment may be implemented with a valve V3, which is operable for throttling a flow of the liquid working fluid 102.

The valve V3 may be operably actuated by temperature sensor T3 or T2 (and/or temperature regulator 108) to throttle a flow rate of the liquid working fluid 102. Valve V2 and/or valve V3 may comprise an actuation interface such as a solenoid, a motorized actuator and/or a servomechanism (servo) based actuator device, which may include an operational amplifier (OpAmp), a linear voltage differential transformer (LVDT), and/or a reluctance type or other type of motor.

An example embodiment may be implemented in which one or more of the temperature sensing and actuating operations described above are performed together (e.g., cooperatively and/or contemporaneously) with one or more of the other temperature sensing and actuating operations to controllably regulate the temperature of the liquid working coolant. The liquid working fluid 102 coolant supply temperature may thus be regulated to maintain the operating temperature below 35 C with the less than ±1 C fluctuation.

FIG. 1 is not drawn to any particular scale and depicts the cooling system 100 figuratively and from no particular angle, perspective or with any component or portion thereof and any particular elevation relative to another portion or component.

The cooling system 104 may also comprise a reservoir component 104 (reservoir) operable for storing a readily accessible makeup volume of the liquid working fluid 102 and/or for maintaining a net positive suction head at the intake of the pump 107. A vent 119 is operable for maintaining a set, throttled, controlled or open access of the reservoir 104 to an ambient pressure characteristic of the atmospheric heat sink. The system 100 is operated with the coolant 102 initially equalized to an ambient pressure of the atmospheric heat sink.

The reservoir 104 maintains a seal over the system 100 while operably accommodating variations of the working fluid stream. An example embodiment may be implemented in which the system 100 is thus operable over ambient atmospheric pressures ranging from 70 kPa to 104 kPa (approx. 10-15 psi), inclusive. Sealed integrity of the system 100 is maintainable over ambient atmospheric pressures ranging from 14 kPa to 104 kPa (approx. 2-15 psi), inclusive.

The system 100 may be operable with internal pressures ranging from 70-350 kPa (approx. 10-60 psi), inclusive. The ranges of the ambient atmospheric operating pressures, ambient atmospheric exposure pressures and/or system internal pressures may be extended by some margin in either direction for reliability, extending operating capabilities, safety, or the like.

One or more filters, other vents, drain(s) at one or more low points, sample accesses to the flow and/or substance of the liquid working fluid 102, and/or inlets and outlets respectively to and from external auxiliary cooling sources may also be included, as well as interfaces for electrical power, instrumentation and/or control sources and the like.

Figure 2:
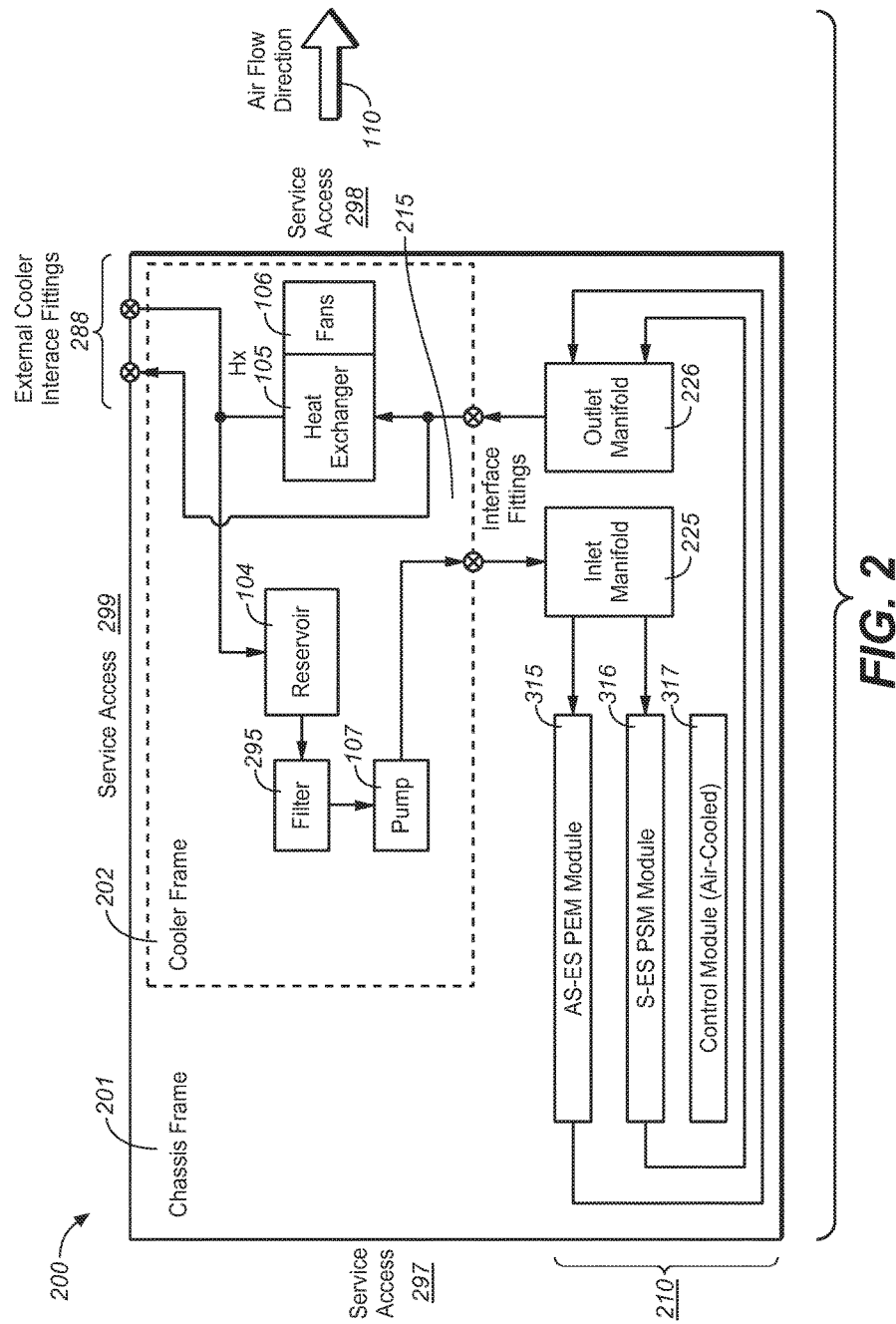
FIG. 2 depicts an example ATE apparatus with an integrated cooling system, according to an embodiment of the present invention.

FIG. 2 depicts an example ATE apparatus 200 with an integrated cooling system, according to an embodiment of the present invention. The ATE apparatus 200 is operable for testing a plurality of (e.g., multiple) memory devices, according to an embodiment of the present invention. The test apparatus 200 comprises a chassis frame 201 and a cooler frame 202. The cooler frame 202 is disposed within the chassis frame 201. The heat exchanger 105 and the pump 107 are disposed within the cooler frame 201. The test module card cage 210, bearing within it the test processor modules 315 and 316 which contain the bays 101 and the test processors μP 0-μP N, may be disposed over the side of the chassis frame. The liquid working 102 fluid flows between the components of cooling system 100 in the cooler frame 201 and the test module card cage 210 via interface fittings 215.

Flowing out of the cooler frame 202 through the outlet of fittings 215, cool liquid working fluid 102 is supplied by an inlet manifold 225 to each bay 101 covering printed circuit assemblies (PCA's) 315 and 316 containing test processor modules. As it flows through the bays 101 on PCA's 315 and 316, the heat generated by operation of the test processors bathed therein transfers to the liquid working coolant 102. The liquid working fluid 102 is then discharged from the bays 101 on PCA's 315 and 316 to an outlet manifold 226. The warm liquid working fluid then returns to the cooling system 100 components within the cooler frame 201 through the inlet interface fitting 215.

The test module card cage 210 may also comprise a test controller 317 operable for controlling the multiple processors. The test controller 317 may be cooled independently of the liquid working fluid 102. For example, the test controller 317 may be air cooled. The processors are disposed on each of the test module PCA's 315 and 316 within bays 101. An example embodiment may be implemented in which the bay 101 has a lower and an upper component fastened to each side of the test module PCA's 315 or 316. One or more of the upper or lower components may be configured to comprise multiple flow paths for the liquid working fluid 102.

Each of the flow paths of the bay components 101 may be sealed as distinctive from each of the others by an array of baffles and gaskets. Cold liquid working fluid 102 is fed to each of the flow paths from the inlet manifold 225. Hot liquid working fluid 102 is returned from each of the flow paths from the outlet manifold 226. Each of the flow paths may bath and cool independent or separate arrays of the multiple test processors μP 0-N, inclusive.

The cooling system pipe tubing 109 may connect to a pair of interface fittings 288, which allow for an inlet and an outlet for the liquid working fluid with an external cooler to increase the cooling capacity for the test system. For example, while the test apparatus 200 and the cooling system 100 integrated therein may be operably deployed in a laboratory or an office milieu, the cooling capacity thereof may be supplemented or replaced by a cooler external to the laboratory or office, such as a tube and shell liquid to liquid heat exchanger and an associated external cooling system or an external refrigeration unit. Alternatively, an example embodiment may be implemented in which the liquid working fluid comprises (or is supplemented with) a liquid coolant (e.g., Fluorinert™ coolant and/or chill water) supplied and discharged via the interface fittings 288 to the integrated cooling system 100.

The direction of the air flow 110 shown in FIG. 2 is arbitrary. Thus, the fans 106 may take a suction from the direction of surface of the heat exchanger 106 that faces the fan intakes and discharge the air flow 110 from the inside of the cooler frame 202, or vice versa (e.g., as shown in FIG. 1). FIG. 2 is not drawn to any particular scale and depicts the cooling system 100 figuratively and from no particular angle, perspective or with any component or portion thereof and any particular elevation relative to another portion or component. An example embodiment may be implemented in which the air flow opposite from the direction shown in FIG. 2.

Figure 3:
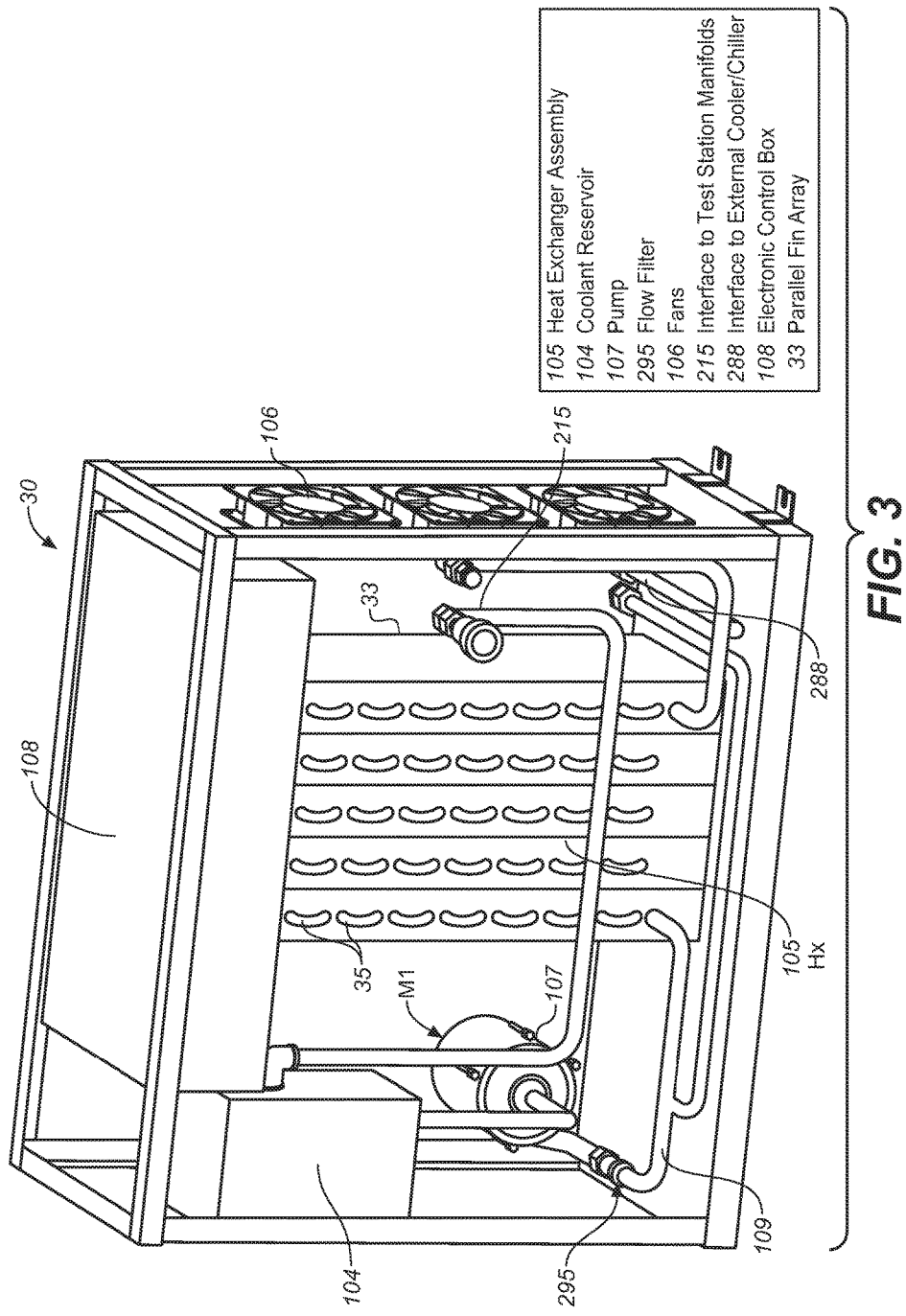
FIG. 3 depicts an example cooler frame, according to an embodiment of the present invention.

FIG. 3 depicts an example cooler frame, according to an embodiment of the present invention. A diagonal upper-side view of the example cooler frame 202 is shown diagonally from one side with a perspective of from above and to the side of the upper fan side corner top view, and with its internal components drawn approximately to scale relative to each other. FIG. 4 depicts a side view of the example cooler frame 202, according to an embodiment of the present invention. FIG. 5 depicts an end view of the example cooler frame 202, according to an embodiment of the present invention. FIG. 5 depicts the cooler frame 202 from the perspective of the fan end.

FIG. 3 and FIG. 4 depict the reservoir 104 above the intake of the pump 107, which helps maintain a net positive suction head for the pump. The tubes 35 of the heat exchanger 105 comprise a substantially parallel array of repetitively articulating sections 35. In FIG. 3, the 'U' shaped common unions of each of the tube sections 35 is shown protruding from the parallel array of substantially planar cooling fins 33 of the heat exchanger 105.

One or more temperature sensors and associated actuators are operable for controllably regulating the temperature of the liquid working coolant to remain essentially constant. With reference again to FIG. 1 for instance, an example embodiment may be implemented in which the temperature sensor T0 is operable for sensing a temperature of the ambient air stream 110 at the intake of the fans 106 and for actuating one or more fans to start, stop or adjust its speed based on the sensed temperature. Thus, as the sensor T0 senses that the temperature of the ambient air 110 falls below a threshold, the sensor T0 may slow or stop one or more fans and, as the temperature of the ambient air 110 rises above the threshold, the sensor T0 may start or speed up one or more fans.

An example embodiment may be implemented in which the temperature sensor T1 is operable for sensing a temperature of the hot liquid working fluid 102 at or close to the inlet of the heat exchanger 105 and for actuating one or more fans 106 to start, stop or adjust its speed based on the sensed temperature. Thus, as the sensor T1 senses that the temperature of the liquid working fluid falls below a threshold, the sensor T1 may slow or stop one or more fans and, as the temperature of the ambient air 110 rises above the threshold, the sensor T1 may start or speed up one or more fans.

An example embodiment may be implemented in which the temperature sensor T2 is operable for sensing a temperature of the cold liquid working fluid 102 downstream from the heat exchanger 105 and for actuating the bypass valve V2 to open, shut or throttle based on the sensed temperature. Thus, as the sensor T2 senses that the temperature of the liquid working fluid falls below a threshold, the sensor T2 may open to allow the liquid working fluid 102 to bypass heat exchanger 105 and, as the temperature of the ambient air 110 rises above the threshold, the sensor T2 may start or open the valve V2 fully open or partially open (e.g., throttled). Another sensor (e.g., sensor T3; FIG. 1) may detect a temperature of the liquid working fluid 102 and actuate another valve (e.g., throttle valve V3; FIG. 1) to change or adjust its position or the pump motor M1 to change or adjust its speed.

Thus, a flow characteristic of the liquid working fluid 102 such as the flow rate may be changed in response to the sensed temperature thereof. One or more of the temperature sensing and actuating operations described above may be performed contemporaneously and/or cooperatively together with one or more of the other temperature sensing and actuating operations to controllably regulate the temperature of the liquid working coolant. The liquid working fluid coolant supply temperature may thus be regulated to maintain the operating temperature below 35 C with the less than ±1 C fluctuation.

During operation, the cooling system 100 and the test apparatus 200 in which it is disposed generate sound levels that do not exceed 60 dBA, for instance. Thus, the cooling system 100 and the test apparatus 200 in which it is integrated are operationally deployable in office or other quiet environments without generating undesirable noise levels therein.

Figure 6A:
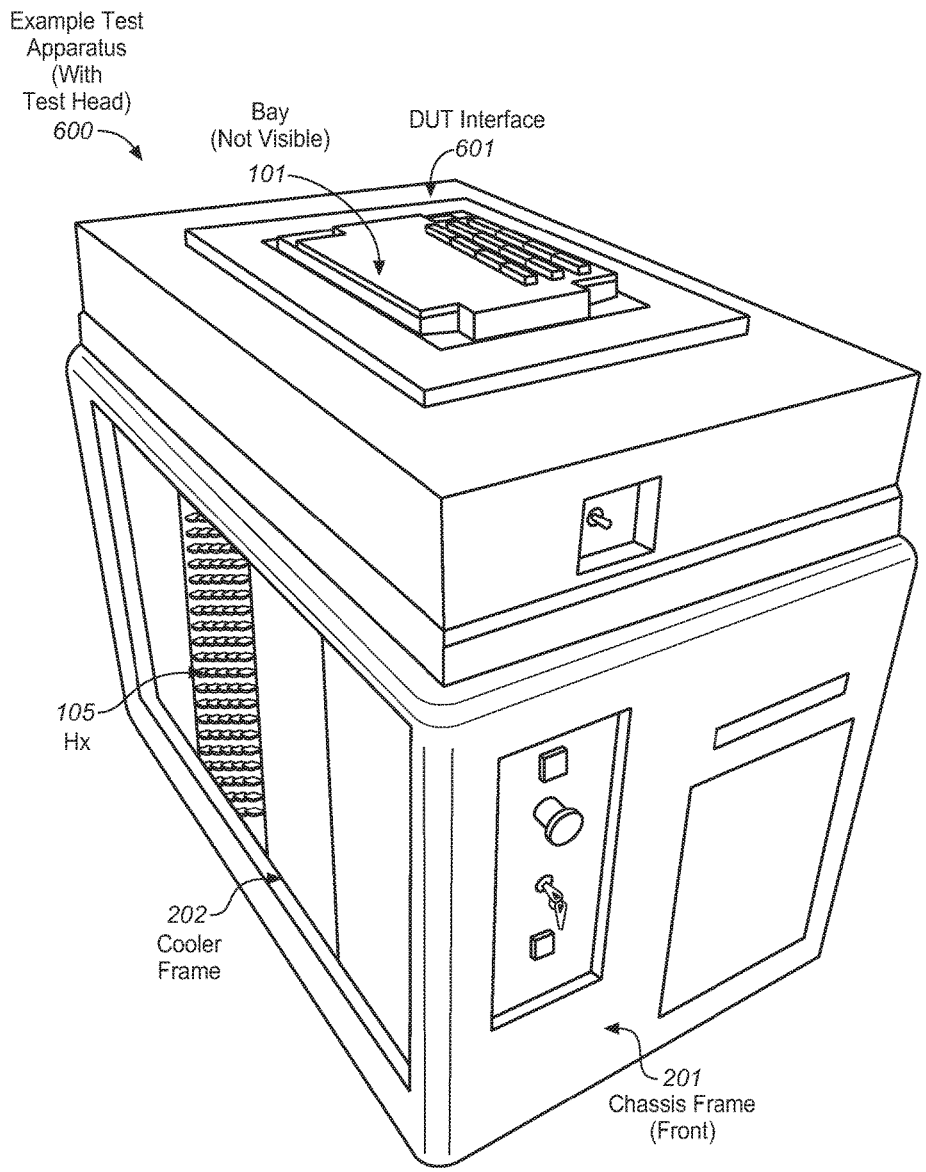
FIG. 6A depicts the interface between a test head and the DUTs with the tester electronics and coolant bays not shown but are located in the lower portion of the chassis frame, behind the heat exchanger.

FIG. 6A depicts an example ATE apparatus with a DUT interface 601 installed, according to an embodiment of the present invention. The test apparatus 600 comprises the chassis frame 201 (FIG. 2) within which the cooler frame 202 (with heat exchanger 105) is disposed. The test apparatus 600 also comprises a test module card cage 210 disposed within the chassis frame 201 and proximate to the DUT interface 601. The DUT interface 601 is mounted over an upper surface of the chassis frame 201. FIG. 6A depicts the test apparatus 600 from a perspective that faces a front right upper corner and internal components exposed on the right side (e.g., upon removal of an access cover).

Figure 6B:
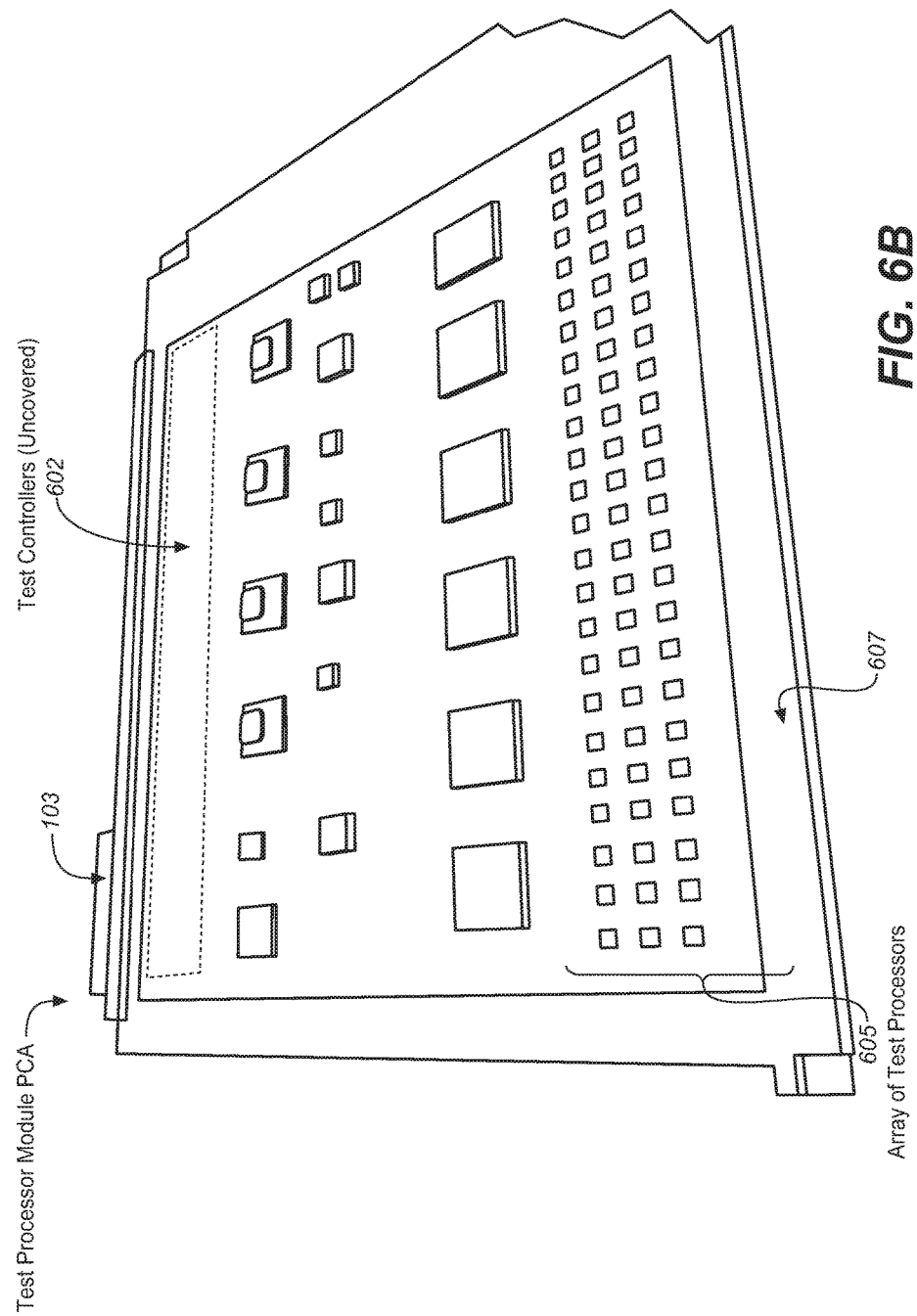
FIG. 6B depicts a test processor module printed circuit assembly PCA, according to an embodiment of the present invention.

FIG. 6B depicts an uncovered example of a test processor module PCA 316 or 317 for an ATE apparatus, according to an embodiment of the present invention. One or more of these can be installed in the chassis frame. The test module PCA 316 or 317 is shown with a cover of the bay component 101 removed to expose an array 605 of multiple test processors (e.g., μP 0-μP N; FIG. 1). FIG. 6B also depicts the test module PCA 316 or 317 with a cover of the test processor controllers 612 removed. These controllers 612 on the PCA are the test processor controllers (as there is also the tester main control board, shown in FIG. 2). The backplane connector 103 is shown for supplying power and communication to/from the test system controller. FIG. 6B also shows a long interface connector, below the test processors 605, which is the test processor signal and power interface to the DUT interface assembly 601.

Figure 6C:
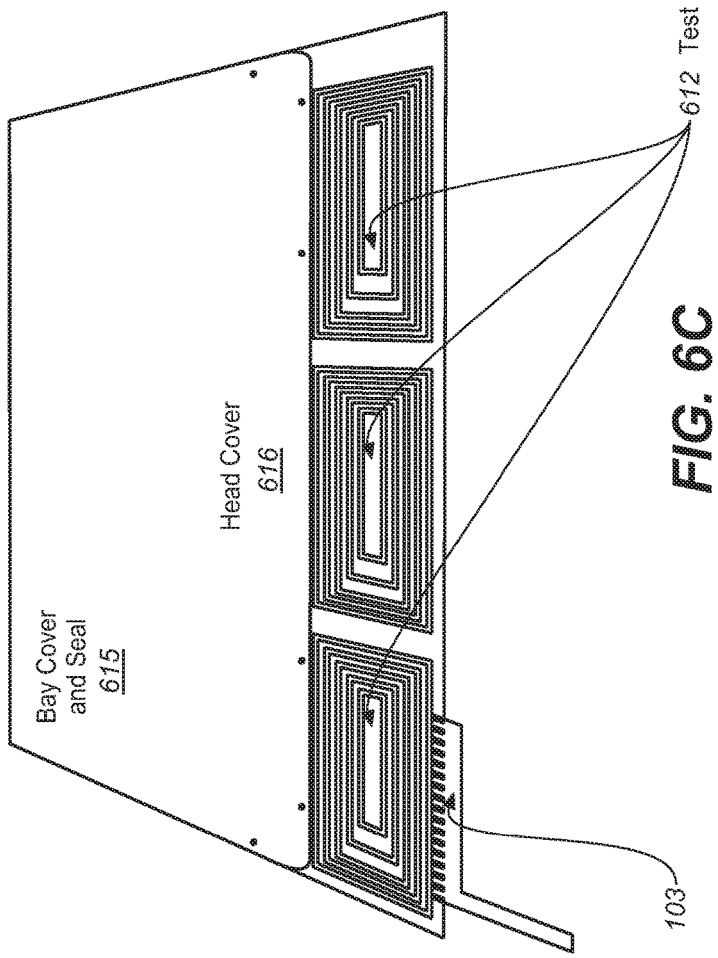
FIG. 6C depicts an example test processor printed circuit assembly for an ATE apparatus, with the test processors covered by the fluid bay, according to an embodiment of the present invention.

FIG. 6C depicts a covered example test head for an ATE apparatus, according to an embodiment of the present invention. The test module PCA 316 or 317 is operable with a liquid-tight and pressure-tight cover 616 of the bay component 101 installed over the array 605 of multiple test processors. FIG. 6C also depicts the test module PCA 316 or 317 and interface 601 with the cover 628 installed over the test processor controllers 612. The back plane connector 103 is depicted adjacent to a test controller cover 628 at an edge and/or corner of the DUT interface 601. The backplane connector 103 is shown for supplying power and communication to/from the test system controller.

Figure 6D:
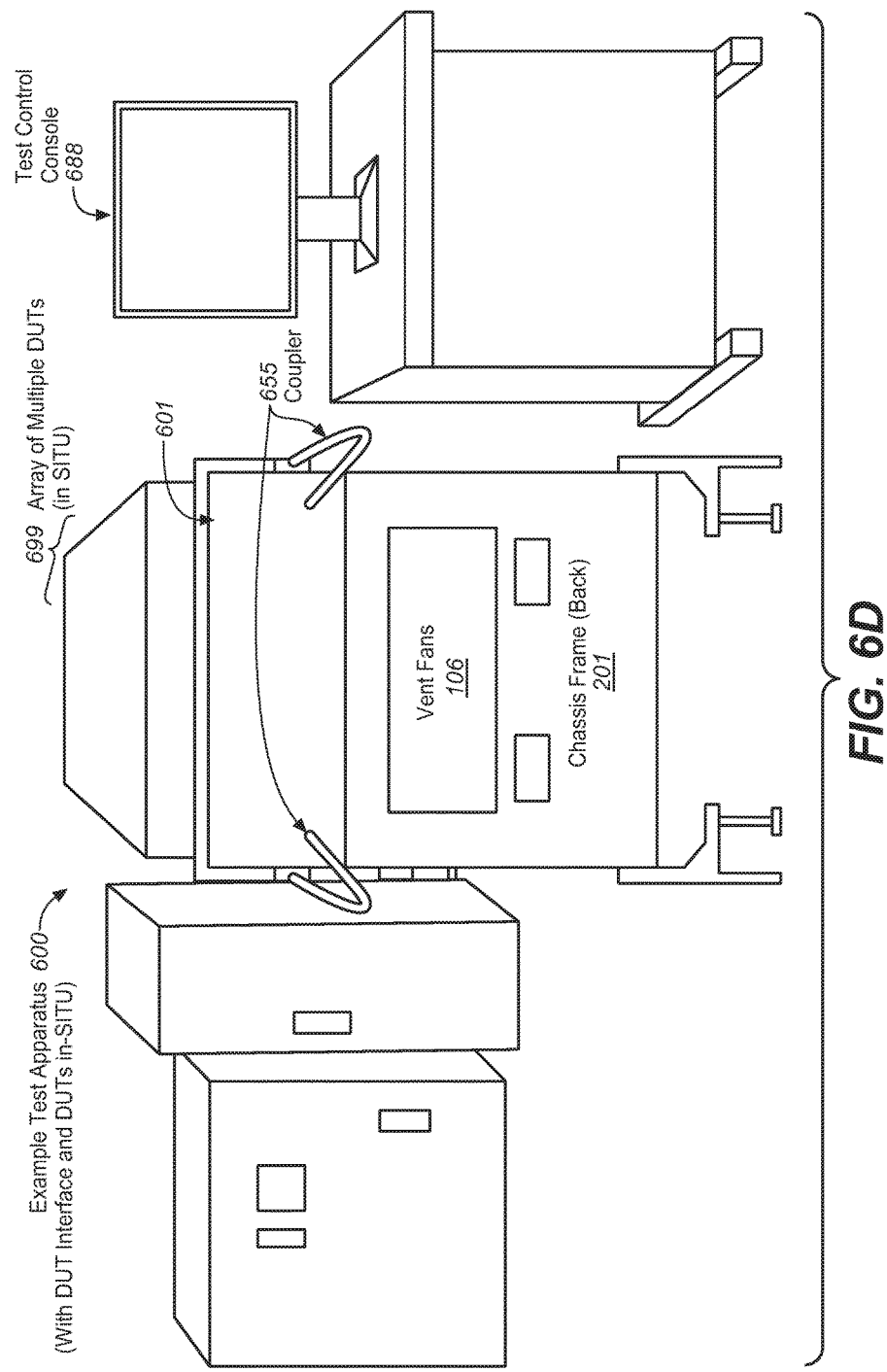
FIG. 6D depicts an example ATE apparatus with a test head interface and an array of multiple DUTs shown in situ, according to an embodiment of the present invention.

FIG. 6D depicts the example ATE apparatus 600 with an array 699 of multiple DUTs shown in situ, according to an embodiment of the present invention. The array 699 of multiple DUTs is disposed over an upper surface of the test head DUT interface 601.

Thus, example embodiments of the present invention are described in relation to an apparatus for testing electronic devices (such as flash memory devices, for example) with an integrated cooling system and to an integrated cooling system for the test apparatus. An embodiment of the present invention relates to a small, quiet integrated cooling system for an apparatus for testing electronic devices, which may be deployed and used in an office environment. Characteristics of the test apparatus including a low noise output, low power consumption and a compact size with a small spatial and volume footprint are selected for deployment and use in a regular office like environment. The apparatus comprises a chassis frame and a cooler frame disposed within the chassis frame and thus integrated within the test apparatus.

The cooling system comprises one or more bay components operable for bathing a plurality of processors of the test apparatus within a liquid working fluid during an operation of the plurality of processors related to the testing the plurality of devices under test wherein heat related to the operation is transferred to the liquid working fluid.

A heat exchange component of the cooling system is disposed within the cooler frame of the test apparatus and is operable for transferring heat from the liquid working fluid to an atmospheric heat sink (e.g., ambient air). A pump component of the cooling system is disposed within the cooler frame of the test apparatus and is operable for moving the liquid working fluid through and between the bay components and the heat exchanger component.

The bay components are mounted to one or both sides of the test processor module PCA's, and the multiple test processors bathed therein proximate to a respective DUT of an array of DUTs and electrically coupled thereto via a test interface for exchanging test data signals related to a test pattern generated by a test controller of the test apparatus.

The cooling system has a controller component operable for regulating a temperature range of the liquid working fluid The controller may comprise temperature sensors operable for sensing a temperature of the liquid working fluid coolant and a temperature of the atmospheric heat sink and for actuating a device for regulating the liquid working fluid temperature.

In an example embodiment of the present invention, the cooling system is operable for performing a process for cooling the liquid working fluid.

Example Cooling Process

FIG. 7 depicts a flowchart of an example cooling process 70, according to an embodiment of the present invention. Process 70 is operable for cooling multiple (a plurality of) processing components in an apparatus, which is operable for testing a corresponding plurality of DUTs. The example method 70 may conform substantially to a process with which a cooling system, integrated within an apparatus for testing electronics (e.g., memory) DUTs, removes heat from test processors during operation thereof. The test processor operations relate to exchanging data signals with the DUTs and computing evaluations thereof based on the exchanged data signals.

In step 71, a liquid working fluid is supplied (e.g., pumped) at a first "cool" temperature to the plurality of processing components, which are bathed within the supplied liquid working fluid during an operation of the multiple processing components related to the testing of the multiple DUTs.

In step 72, a heat generated in each of the multiple processing units, during and related to the operation thereof, is transferred to the liquid working fluid. The liquid working fluid is thus heated to a second temperature, which is higher than the first cool temperature. The liquid working fluid thus comprises a primary coolant.

In step 73, the heated liquid working fluid at the second temperature is transported (e.g., under the pumping pressure) away from the multiple processors. In step 74, the heat from the liquid working fluid at the second temperature is transferred to an atmospheric heat sink such as a stream of ambient air, which thus comprises a gaseous working fluid and a secondary coolant.

In step 75, a temperature range of the liquid working fluid is controlled based on a sensed temperature of the primary coolant and/or the secondary coolant to remain essentially constant (e.g., within ±1 C). For example, a flow rate (or other characteristic of the liquid working fluid flow) may be changed in response to the sensed temperature thereof and/or a fan speed may be adjusted (e.g., between 20% and 100% of nominal full air flow rating) based on the sensed temperature of the stream of the gaseous working fluid. One or more of the temperature sensing and actuating operations described above may be performed contemporaneously and/or cooperatively together with one or more of the other temperature sensing and actuating operations to controllably regulate the temperature of the liquid working coolant to remain essentially constant. The liquid working fluid coolant supply temperature may thus be regulated to maintain the operating temperature below 35 C with the less than ±1 C fluctuation.

In an example embodiment of the present invention, the performance of the process 70 does not generate sound levels that exceed 60 dBA, for instance. Thus, the process 70 may be performed by a cooling system integrated within a test apparatus disposed in laboratory or office milieu or deployed therein without raising ambient noise to unacceptable or disturbing levels.

An example embodiment may be implemented in which the atmospheric heat sink comprises air and in which the transporting the heated liquid working fluid at the second temperature away from the multiple processors comprises moving the liquid working fluid at the second temperature from an inlet of a heat exchanger through a tube thereof, to an outlet of the heat exchanger. The tube comprises a heat conducting material. The transferring the heat from the liquid working fluid at the second temperature to the atmospheric heat sink comprises ventilating an array of parallel heat conducting fin surfaces thermally coupled to the tube with a stream of the air across the parallel surfaces. The heat is transferred from the liquid working fluid to the air stream. Thus upon its discharge from the heat exchanger outlet, the liquid working fluid is again cooled to the first temperature.

An example embodiment may be implemented in which the controlling a temperature range of the liquid working fluid comprises adjusting the speed of a fan associated with the ventilation of the parallel heat conducting fin surfaces. The controlling a temperature range of the liquid working fluid may comprise adjusting a flow characteristic of the liquid working coolant.

The adjusting a flow characteristic of the liquid working coolant may comprise diverting a flow of the liquid working fluid from a point between the inlet of the heat exchanger and the inlet to the plurality of processing moments thereof and/or throttling a flow rate of the liquid working fluid.

An example embodiment may be implemented in which the throttling a flow rate of the liquid working fluid comprises repositioning a valve disk relative to a valve seat of a valve through which the liquid working fluid flows and/or adjusting the speed of a pump associated with the supplying the liquid working fluid at the first temperature to the plurality of processing components.

The flow characteristic of the liquid working fluid coolant may also be adjusted with a user action. For example, a user may reposition a position of an internal disk of the valve V1 manually to impede or un-impede the coolant, to replace a section of the pipe tubing with a more or a less constricted cross section, or extend or direct a portion of the coolant flow through a non-operating section of a test head, such as a "dummy" module in place of an active electronics module comprising operating test processors.

Further, the adjusting a flow characteristic of the liquid working coolant may comprise obstructing a flow of the liquid working fluid with an impediment added at a point within the flow stream or a constriction in a section of the pipe tubing. Further, In an example embodiment of the present invention, the cooling system is operable for performing a process for cooling the liquid working fluid and maintaining its temperature essentially constant. Thus, an example embodiment of the present invention is described in relation to a method for cooling a plurality of processing components in a test apparatus operable for testing a corresponding plurality of DUTs. The process comprises supplying (e.g., pumping) a liquid working fluid at a first temperature to the plurality of processing components wherein the plurality of processing components is bathed within the supplied liquid working fluid during an operation of the plurality of processing components related to the testing of the multiple DUTs.

Heat generated in each of the multiple processing units during and operation thereof is transferred to the liquid working fluid. The liquid working fluid is thus heated to a second temperature, which is higher than the first temperature, and then transported away from the plurality of processors under the force of the pumping. The heat is then transferred within a liquid-to-gas heat exchanger from the heated liquid working fluid at the second temperature to an atmospheric heat sink (e.g., a stream of ambient air). A temperature of the liquid working fluid and/or the atmospheric heat sink is sensed and a temperature range of the liquid working fluid is controlled based on the sensed temperature.

Thus, an example embodiment of the present invention is described in relation to described in relation to an integrated cooling system for an apparatus for testing electronic devices. Characteristics of the test apparatus including a low noise output, low power consumption and a compact size with a small spatial and volume footprint are selected for deployment and use in a laboratory or an office type environment. The test apparatus comprises a chassis frame and a cooler frame disposed within the chassis frame and thus, integrated within the test apparatus.

The cooling system comprises one or more bay components operable for bathing a plurality of processors of the test apparatus within a liquid working fluid during an operation of the plurality of processors related to the testing the plurality of devices under test wherein heat related to the operation is transferred to the liquid working fluid. A heat exchanger of the cooling system is disposed within the cooler frame of the test apparatus and is operable for transferring heat from the liquid working fluid to an atmospheric heat sink (e.g., ambient air). A pump of the cooling system is disposed within the cooler frame of the test apparatus and is operable for transporting the liquid working fluid through and between the bay component and the heat exchanger component. An example embodiment is implemented in which the pump comprises a centrifugal pump, which draws an intake of cooled liquid working fluid from an outlet of the heat exchanger and discharges the cool liquid working fluid with force sufficient to flow to and through the bay component and return to an inlet of the heat exchanger.

The bay components may be mounted to the test processor module printed circuit assemblies covering the multiple test processors therein proximate to a respective DUT of an array of DUTs and electrically coupled thereto via a test interface for exchanging test data signals related to a test pattern generated by a test controller of the test apparatus.

The cooling system has a controller component operable for regulating a temperature range of the liquid working fluid The controller may comprise temperature sensors operable for sensing a temperature of the liquid working fluid coolant and a temperature of the atmospheric heat sink and for actuating a device for regulating the liquid working fluid temperature. An example embodiment is implemented in which the sensors provide input to a component, such as a microcontroller or a field programmable gate array, which is programmed and/or configured for controllably regulating the liquid working fluid temperature.

An embodiment of the present invention relates to a small, quiet integrated cooling system for an apparatus for testing electronic devices, which may be deployed and used in an office environment. Characteristics of the test apparatus and integrated cooling system including a low noise output, low power consumption and a compact size with a small spatial and volume footprint are selected for deployment and use in a regular office like environment.

In an example embodiment of the present invention, test processors bathed within a liquid coolant test multiple electronic DUTs. Heat from the processors is transferred to the liquid coolant. A heat exchanger transfers heat from the liquid coolant to air. A pump circulates the liquid coolant between the processors and heat exchanger. A temperature range of the liquid coolant is regulated based on the sensed temperatures.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A cooling system disposed within a test apparatus operable for testing a plurality of devices under test, the cooling system comprising:
    a bay disposed over printed circuit assemblies (PCA) test processor modules of the test apparatus, wherein the PCA test processor modules comprise a plurality of test processors, wherein the bay is operable for bathing the PCA test processor modules entirely inside a liquid working fluid during an operation of the plurality of test processors for testing the plurality of devices under test, wherein heat related to the operation of the PCA test processor modules is transferred to the liquid working fluid, and wherein the PCA test processor modules are disposed in a test head of the test apparatus and each of the plurality of devices under test is tested by a respective one of the plurality of test processors;

a heat exchanger disposed within the test apparatus and operable for transferring heat from the liquid working fluid to air;

a pump component disposed within the test apparatus and operable for driving the liquid working fluid through and between the bay and the heat exchanger; and a controller disposed within the test apparatus and operable for regulating a temperature range of the liquid working fluid based on a sensed temperature thereof, wherein the test apparatus comprises a chassis frame and a cooler frame, wherein the cooler frame is disposed within the chassis frame and wherein at least one of the heat exchanger and the pump component is disposed within the cooler frame, and wherein the test head is-disposed upon the chassis frame during a testing operation.

2. The cooling system as recited in claim 1 further comprising a ventilation component operable for driving air through the heat exchanger.

3. The cooling system as recited in claim 2 wherein the ventilation component comprises a fan.

4. The cooling system as recited in claim 2 wherein the controller is operable for regulating the temperature of the liquid working fluid based upon input received from one or more temperature sensors, the one or more temperature sensors sense a temperature of at least one of:
   an intake of the ventilation component
   the liquid working fluid at an inlet of the heat exchanger; and
   the liquid working fluid at an outlet of the heat exchanger;
   the controller is further operable for controlling an output flow of air from the ventilation component based on the sensed temperature at the intake of the ventilation component;
   and the controller is further operable for controlling one or more actuating devices, the one or more actuating devices operable for adjusting a flow characteristic of the liquid working fluid.

5. The cooling system as recited in claim 4 wherein the one or more actuating devices comprises a bypass valve, and wherein the bypass valve is operable for adjusting the flow characteristic of the liquid working fluid by controllably diverting a flow of the liquid working fluid in relation to the heat exchanger in response to detecting a temperature decrease at the outlet of the heat exchanger.

6. The cooling system as recited in claim 4 wherein the one or more actuating devices comprises a throttle valve, and wherein the throttle valve is operable for adjusting the flow characteristic of the liquid working fluid by throttling a flow of the liquid working fluid in relation to the bay in response to a detected temperature change of the liquid working fluid.

7. The cooling system as recited in claim 1 wherein the pump component comprises a centrifugal pump and a motor and wherein a speed of the motor is operable to be throttled in response to a detected temperature change of the liquid working fluid.

8. The cooling system as recited in claim 1 wherein the heat exchanger comprises tube sections operable to allow the liquid working fluid to flow therein, each of the tube sections disposed within an array of parallel sheets.

9. A testing apparatus for testing a plurality of devices under test, the test apparatus comprising:
   a chassis frame;
   a test head disposed upon the chassis frame and proximate to the plurality of devices under test, wherein the test head comprises printed circuit assemblies (PCA) test modules that comprise a plurality of test processors for testing said plurality of devices under test, wherein a bay is disposed over the PCA test modules, wherein heat generated by the plurality of test processors is transferred to a liquid working fluid, wherein the PCA test modules are submerged in the liquid working fluid, wherein the bay is operable for bathing the PCA test modules entirely in the liquid working fluid, and wherein each of the plurality of devices under test is tested by a respective one of the plurality of test processors; and
   a cooler frame disposed within the chassis frame, the cooler frame comprising a cooling system operable for transferring heat from the liquid working fluid to air, wherein the cooling system comprises:
      a pump operable for driving the liquid working fluid through the cooling system;
      a heat exchanger operable for the transferring heat from the liquid working fluid to air;
      a fan operable for ventilating a cooling surface of the heat exchanger with air;
      one or more controllably adjustable valves; and
      a controller operable for regulating a temperature of the liquid working fluid.

10. The testing apparatus as recited in claim 9 wherein the controller is operable for regulating the temperature of the liquid working fluid based upon input received from at least one sensor, wherein the at least one sensor is operable for detecting a liquid working fluid temperature; and
   the controller is further operable for controlling the one or more controllably adjustable valves and a motor, the one or more controllably adjustable valves and the motor are operable for adjusting, based on a detected liquid working fluid temperature a flow characteristic of the liquid working fluid.

11. The testing apparatus as recited in claim 10 wherein the one or more controllably adjustable valves comprises a throttle valve and a bypass valve, and
   the bypass valve to is operable for diverting a flow of the liquid working fluid from the heat exchanger; and
   the throttle valve is operable for throttling a flow rate of the liquid working fluid.

12. The testing apparatus as recited in claim 10 wherein the one or more controllably adjustable valves comprises a bypass valve, and
   the bypass valve is operable for diverting a flow of the liquid working fluid from the heat exchanger; and
   the motor is operable for changing a speed of the pump.

* * * * *